United States Patent [19]

Goldman et al.

[11] 4,151,537
[45] Apr. 24, 1979

[54] GATE ELECTRODE FOR MNOS SEMICONDUCTOR MEMORY DEVICE

[75] Inventors: Ernest A. Goldman, Stow; Moe S. Wasserman, Sherborn, both of Mass.

[73] Assignee: GTE Laboratories Incorporated, Stamford, Conn.

[21] Appl. No.: 822,010

[22] Filed: Aug. 5, 1977

Related U.S. Application Data

[63] Continuation-in-part of Ser. No. 665,470, Mar. 10, 1976, abandoned.

[51] Int. Cl.² .............................................. H01L 29/78
[52] U.S. Cl. ........................................ 357/23; 29/571; 357/54; 357/59; 357/65; 365/182
[58] Field of Search ................... 357/23, 54, 65, 59; 365/182; 29/571

[56] References Cited

U.S. PATENT DOCUMENTS

| | | | |
|---|---|---|---|
| 3,853,496 | 12/1974 | Kim | 357/23 |
| 3,878,549 | 4/1975 | Yamazaki et al. | 357/23 |
| 3,967,981 | 7/1976 | Yamazaki | 357/23 |

Primary Examiner—Martin H. Edlow
Assistant Examiner—James W. Davie
Attorney, Agent, or Firm—David M. Keay

[57] ABSTRACT

Optimized switching and retention characteristics of an MNOS memory device are obtained by using as a gate electrode material either metals or semi-metals having a high work function, in conjunction with a gate dielectric layer having a low density of trapping states throughout its volume. The preferred gate electrode materials are either titanium or p+-doped polycrystalline silicon.

12 Claims, 1 Drawing Figure

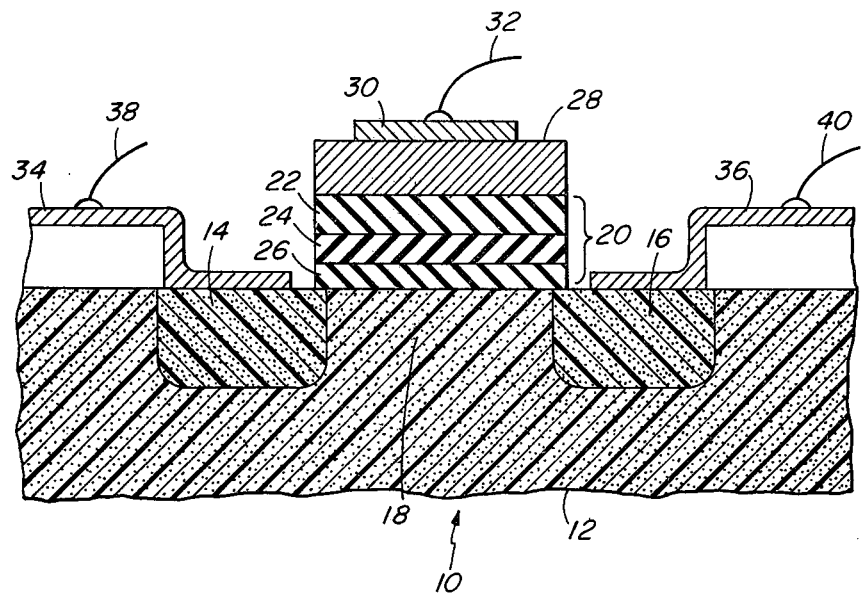

GATE ELECTRODE FOR MNOS SEMICONDUCTOR MEMORY DEVICE

CROSS-REFERENCE TO PARENT APPLICATION

This application is a continuation in part of application Ser. No. 665,470, filed Mar. 10, 1976, and now abandoned.

BACKGROUND OF THE INVENTION

The present invention relates to semiconductor memory devices and, more specifically, to metal-nitride-oxide-silicon (MNOS) memory devices.

The gate electrode of a conventional MNOS device consists of an evaporated layer of high-purity aluminum, usually as part of the metallization pattern employed in the integrated circuit which contains the MNOS memory. This aluminum is contiguous with the uppermost of a plurality of dielectric layers such as silicon nitride, silicon oxy-nitride, and silicon dioxide, which cover the silicon chip. In the memory gate areas, the lowermost or silicon dioxide layer is very thin, of the order of 20 Å, which is conducive to tunneling of charges between the silicon and traps located in the dielectric adjacent to the silicon dioxide layer during application of a voltage pulse between the gate electrode and the silicon substrate. This tunneling mode of charge transport and storage is generally used in MNOS memory applications where long retention time is more important than ultra-fast writing and erasing. In order to maximize retention time, further trade-offs are involved in the choice of process parameters during the fabrication of the gate dielectric. Thus, for instance, as described in "Trap-assisted Charge Injection in MNOS Structures" by C. Svensson et al., J. App. Phys. 44, No. 10, p. 4662 (Oct. 1973), lower trap densities in the oxide-to-nitride interface region and correspondingly higher writing and erasing fields required for equal switching effects will yield longer retention.

A problem, however, arises as high fields are applied to a low-trap-density dielectric of maximum charge retention. The charging current by injection from the metal electrode and conduction through the nitride, between metal electrode and trapping layer, is no longer negligible compared to the charging current by tunneling through the thin oxide layer. The nitride current opposes the tunneling and, due to increasing nitride conductivity with increasing field, causes saturation, as is known from "Theory of the Maximum Charge Stored in the Thin Oxide MNOS Memory Transistor", C. Svensson, Proc. IEEE 59, p. 1135 (July, 1971) and from "Characterization of Thin-Oxide MNOS Memory Transistors", M. H. White et al., IEEE Trans. ED-19, No. 12, p. 1285 (Dec. 1972), and even reversal of the desired switching effect. As a result, the magnitude of the obtainable threshold shift may be insufficient. In case of p-channel devices, this limitation is serious with the pulse polarity used for "writing", i.e., with the negative potential applied to the gate electrode. Sufficiently high OFF-state thresholds thus may be difficult to attain. At the present state of the art the problem has been avoided by the choice of parameters in the fabrication process of the gate dielectric that tend to facilitate tunneling but entail a corresponding loss in retention.

SUMMARY OF THE INVENTION

It is an object of the present invention to provide an MNOS memory device in which control of the switching properties of the device is obtained by minimizing carrier injection from the gate electrode which competes with the desired carrier transport to and from the semiconductor substrate.

Another object of the present invention is to achieve desirable switching as well as retention characteristics by minimizing the nitride current without detriment to tunneling or retention characteristics.

The present invention relates to an improved gate electrode material for semiconductor memory devices. The device has a substrate made of a semiconductive material of a first conductivity type. A source and drain made of a second conductivity type are non-contiguously disposed in a surface region of the substrate. The substrate surface region between the source and the drain defines the channel of the device. A gate insulator covers the channel and at least a portion of the source and the drain adjacent to the channel. The insulator comprises a plurality of layers of dielectric material. According to the invention, a gate electrode covers the gate insulator, the electrode being made of a conductive material having a work function greater than that of aluminum and being capable of adequately adhering to the gate insulator. The conductive material minimizes electron injection into the material of the gate insulator. One preferred material for the gate electrode is titanium. Another preferred material is a degenerate semiconducting material, such as p+-doped polycrystalline silicon.

BRIEF DESCRIPTION OF THE DRAWING

In the drawing:

The sole FIGURE is a cross-sectional view of an MNOS semiconductor memory device according to the present invention.

DESCRIPTION OF PREFERRED EMBODIMENTS

In an exemplary embodiment of the present invention, as illustrated in the FIGURE, there is shown an MNOS memory device, represented generally by the reference numeral 10. A substrate 12 is made of a semiconductive material of a first conductivity type. The substrate should have free carrier concentrations of approximately $10^{14}$ to $10^{16} cm^{-3}$. In the embodiment, the substrate 12 is an n-doped silicon substrate. A source 14 and a drain 16 are made of a semiconductive material of a second conductivity type which, in the example, is a p+-doped semiconductive material. The source and drain are non-contiguously disposed in the surface regions of the substrate 12 such that the substrate surface region between the source 14 and the drain 16 define a channel, represented generally by the reference numeral 18. A gate insulator, represented generally by the reference numeral 20, covers the channel 18 and at least a portion of the source 14 and the drain 16 adjacent to the channel 18. The gate insulator 20 includes a plurality of layers of dielectric material indicated by the reference numerals 22, 24 and 26. Preferably, the layer 22 is silicon nitride, the layer 24 is silicon oxy-nitride and the layer 26 is silicon dioxide. If desired, other layers of insulating materials, such as aluminum oxide and aluminum nitride, may be used in addition to the above layers or in substitution thereof.

Whatever the choice of insulating material for layer 24, it should contain a low density of trapping states, such that the volume density integrated over the layer thickness of up to several hundred Angstroms is typically $2 \times 10^{12}$ states/cm$^2$, to insure that the threshold voltages attained after application of a voltage pulse will be maintained for as long as ten years with a degradation of no more than about 20 percent. By contrast, an insulator with $6-8 \times 10^{12}$ states/cm$^2$, as cited in U.S. Pat. No. 3,853,496 by Manjin J. Kim, has a retention time of only one year with a 20 percent degradation.

According to the invention, a gate electrode 28 covers the gate insulator 20; this electrode is made of a conductive material having a work function greater than that of aluminum. The material must also be capable of adequately adhering to the gate insulator. Preferably, the gate electrode 28 is made either of titanium or a degenerate semiconductive material such as p+-doped polycrystalline silicon.

In the embodiment, a layer 30 of conductive material, such as aluminum, is disposed over the gate electrode material 28. This layer facilitates the formation of an electrical contact 32. Likewise, layers of conducting materials 34 and 36 disposed over the source 14 and the drain 16, respectively, facilitate the formation of electrical contacts 38 and 40. Preferably, the material 34 and 36 is also aluminum.

Although the use of a low-trap-density insulator leads to long retention times, this type of insulator requires the application of a high electric field, typically $5-7 \times 10^6$ volts/cm, to achieve a useful threshold separation. By contrast, a structure with shorter retention time, as cited in U.S. Pat. No. 3,853,496 by M. J. Kim, requires an electric field of less than $4 \times 10^6$ volts/cm. The high electric field would normally cause an increase in the current of electrons injected from the gate electrode into the nitride that would counteract the desired tunneling current. The present invention achieves the desirable switching characteristics as well as long retention by minimizing the nitride current without a corresponding detriment to the tunneling or retention characteristics. We have observed that, contrary to the teachings in the publications of Deal et al., J. Electrochem. Soc., Vol. 115, p. 303 (March 1968) and Brown et al., J. Electrochem. Soc., Vol. 115, p. 952/953 (September 1968), the conductivity of silicon nitride appears to show a strong dependence on the material of the gate electrode which is used. DC current vs. voltage measurements performed on silicon nitride films between aluminum and p-type degenerate silicon electrodes consistently showed conductivities that were 1 to 3 orders of magnitude higher when the aluminum electrode was negative. Another observation concerned flat-band voltage shifts obtained on MNOS capacitors with negative pulses applied either to aluminum capacitor dots or to a gold probe used as metal electrodes. Invariably the gold probe produced larger shifts with increasing negative voltage than the aluminum dots. This experiment was repeated with sets of evaporated gold and aluminum capacitor dots on one MNOS wafer. The following table shows typical values of flat-band voltages obtained initially and after applying switching pulses of $-30$ and $-45$ volts, respectively, as well as the corresponding shifts.

|  | $V_{FBO}$ | $V_{FB-30}$ | $V_{FB-45}$ | $(\Delta V_{FB})_{-30}$ | $(\Delta V_{FB})_{-45}$ |
|---|---|---|---|---|---|
| Al dots | $-4.45$ | $-6.0$ | $-6.2$ | $-1.55$ | $-1.75$ |
| Au dots | $-3.5$ | $-5.8$ | $-10.5$ | $-2.3$ | $-7.0$ |

It is evident that saturation of the "negative window" within the switching voltage range used occurs with aluminum, but not with gold electrodes. Apparently, the lower work function of aluminum causes increased electron injection into the silicon nitride, which is responsible for higher conductivity and the observed saturation by competition of the nitride current with the tunneling current flowing between the silicon wafer and the trapping region in the dielectric.

The essence of the present invention is the optimization of switching as well as retention characteristics of MNOS memory structures by the choice of a suitable gate electrode material. The selection of such electrode metal or degenerate semiconductor is done for minimum electron injection into silicon nitride and for compatibility with MNOS device and circuit processing. Injection is minimized with a gate electrode material having a high work function, such as gold, but gold fails to meet the process compatibility requirement because of its poor adherence to silicon nitride and other insulators.

Titanium forms a compatible system with silicon and aluminum as is described in Bower, App. Phys. Letters, 23, No. 2, p. 99/101 (Jan. 15, 1973) and shows acceptable adherence to silicon nitride. Titanium has a work function greater than that of aluminum. Comparison of switching characteristics of MNOS capacitors with Al and Al-on Ti dots as electrodes on the same wafer showed a considerable advantage of titanium as effective gate electrodes as seen from the following table of flat-band voltages:

|  | $V_{FBO}$ | $V_{FB-30}$ | $V_{FB-45}$ | $(\Delta V_{FB})_{-30}$ | $(\Delta V_{FB})_{-45}$ |
|---|---|---|---|---|---|
| Al dots | $-4.7$ | $-7.15$ | $-6.75$ | $-2.45$ | $-2.05$ |
| Al on Ti dots | $-4.5$ | $-8.25$ | $-11.0$ | $-3.75$ | $-6.5$ |

It has also been found that p+-doped polycrystalline silicon may be used as the gate electrode material of an MNOS memory device. The compatibility of this material with MNOS processing hinges on controlling the effect of heat treatments, required to be done after the deposition of the gate dielectric, on the final characteristics of the MNOS structure. The dielectric deposition parameters must be adjusted to yield the desired switching and retention characteristics after completion of the subsequent polycrystalline silicon deposition, oxidation and boron diffusion processes. The following typical flatband voltages were obtained on MNOS capacitor wafers after complete polycrystalline silicon processing and subsequent aluminum metallization.

|  | $V_{FBO}$ | $V_{FB-30}$ | $V_{FB-45}$ | $(\Delta V_{FB})_{-30}$ | $(\Delta V_{FB})_{-45}$ |
|---|---|---|---|---|---|
| Al dots | $-3.0$ | $-7.95$ | $-8.3$ | $-4.95$ | $-5.3$ |
| Al on B-doped poly-si dots | $-2.45$ | $-9.65$ | $-11.85$ | $-7.2$ | $-9.4$ |

Broadly, the invention resides in the use as a gate electrode of suitable metals or semi-metals having a high work function in order to optimize the switching and retention characteristics of MNOS memories. The effect obtained is related to electron injection from the gate electrode into the adjacent insulator of the MNOS gate structure and unrelated to known effects of the work function of the gate electrode material on the threshold or turn-on voltage of MOS and similar structures; thus, p+-doped polycrystalline silicon gate electrodes have been used extensively for controlling flatband or threshold voltages in MOS systems by their difference in work function compared to aluminum electrodes. Also, titanium-aluminum contacts have been used in integrated circuits, but for the purpose of suppressing the formation of localized pits formed in the silicon contact areas by excessive dissolution of silicon in aluminum.

The embodiment of the present invention is intended to be merely exemplary and those skilled in the art shall be able to make numerous variations and modifications of it without departing from the spirit and scope of the present invention. All such variations and modifications are intended to be within the scope of the present invention as defined by the appended claims.

We claim:

1. In a semiconductor memory device including a substrate made of a semiconductive material of a first conductivity type, a source and a drain made of a semiconductive material of a second conductivity type and being non-contiguously disposed in surface regions of said substrate so that the substrate surface region between said source and drain defines a channel, a gate insulator covering said channel and at least a portion of said source and drain adjacent to said channel, said gate insulator including a plurality of layers of dielectric material, and a gate electrode covering said gate insulator, an improvement comprising a dielectric region within said gate insulator having a density of trapping states of about $2 \times 10^{12}$ states per square centimeter and being separated from said channel by a tunneling-conducive distance; and said gate electrode being made of a conductive material having a work function greater than that of aluminum and capable of adequately adhering to said gate insulator for minimizing electron injection from said gate electrode into the material of said gate insulator during the application of high voltage pulses between said gate electrode and said substrate.

2. The semiconductor memory device according to claim 1 wherein said gate electrode is made of titanium.

3. The semiconductor memory device according to claim 1 wherein said gate electrode is made of a degenerate semiconducting material.

4. The semiconductor memory device according to claim 3 wherein said degenerate semiconducting material is p+-doped polycrystalline silicon.

5. The semiconductor memory device according to claim 2 further including:

(a) a layer of a conducting material disposed on said gate electrode to facilitate the formation of an electrical contact, and (b) a layer of a conducting material on said source and said drain to facilitate the formation of electrical contacts.

6. The semiconductor memory device according to claim 5 wherein said conducting material on said gate electrode is aluminum.

7. The semiconductor memory device according to claim 6 wherein said conducting material on said source and drain is aluminum.

8. A method for improving the memory retention of a semiconductive memory device of the type normally including a substrate made of a semiconductive material of a first conductivity type, a source and a drain made of semiconductive material of a second conductivity type and being non-contiguously disposed in surface regions between said source and drain to define a channel, a gate insulator covering said channel and at least a portion of said source and drain adjacent to said channel, said gate insulator including a plurality of layers of dielectric material, and a gate electrode covering said gate insulator, said method comprising the steps of:

forming a dielectric region within said gate insulator having a density of trapping states of about $2 \times 10^{12}$ states per square centimeter and at a tunneling-conducive distance from said channel; and suppressing the flow of electron injection current from said gate electrode into said gate insulator with a conductive material capable of adhering to said gate insulator and having a work function greater than that of aluminum.

9. The method of claim 8 wherein said gate electrode is formed from titanium.

10. The method of claim 8 wherein said gate electrode is formed from a degenerate semiconducting material.

11. The method of claim 8 including the subsequent steps of:

forming a layer of conducting material on said gate electrode to facilitate the formation of an electrical contact; and forming a layer of conducting material on said source and said drain to facilitate the formation of electrical contacts.

12. A method for suppressing electron injection from the gate electrode into the gate insulator of a semiconductor memory device of the type including a substrate made of a semiconductive material of a first conductivity type, of a source and a drain made of a second conductivity type and being non-contiguously disposed in surface regions of said substrate so that the substrate surface regions between said source and drain define a channel, a gate insulator covering said channel and at least a portion of said source and drain adjacent to said channel, said gate insulator including a plurality of layers of dielectric material, a gate electrode covering said gate insulator, said method comprising the steps of:

forming a dielectric region within said gate insulator having a density of trapping states of about $2 \times 10^{12}$ states per square centimeter and at a tunneling-conducive distance from said channel; and forming said gate electrode from a conductive material having a work function greater than that of aluminum and being capable of adequately adhering to said gate insulator.

* * * * *